United States Patent [19]
Sachdev et al.

[11] Patent Number: 4,665,006
[45] Date of Patent: May 12, 1987

[54] POSITIVE RESIST SYSTEM HAVING HIGH RESISTANCE TO OXYGEN REACTIVE ION ETCHING

[75] Inventors: Krishna G. Sachdev; Ranee W. Kwong, both of Wappingers Falls; Mahmoud M. Khojasteh, Fishkill; Harbans S. Sachdev, Wappingers Falls, all of N.Y.

[73] Assignee: International Business Machines Corporation, Armonk, N.Y.

[21] Appl. No.: 806,597

[22] Filed: Dec. 9, 1985

[51] Int. Cl.⁴ .................. G03C 5/16; G03C 1/495; G03F 7/26

[52] U.S. Cl. ........................... 430/270; 430/326; 430/311; 430/313; 430/323; 430/176; 430/914; 430/921; 430/922; 430/925; 430/919

[58] Field of Search ............... 430/270, 326, 311, 313, 430/323, 176, 914, 921, 922, 925, 919

[56] References Cited

U.S. PATENT DOCUMENTS

| | | | |
|---|---|---|---|
| 3,961,099 | 6/1976 | Gipstein et al. | 430/296 X |
| 4,245,029 | 1/1981 | Crivello | 430/280 |
| 4,256,828 | 3/1981 | Smith | 430/280 |
| 4,306,953 | 12/1981 | Schlesinger | 526/193 |
| 4,374,077 | 2/1983 | Kerfeld | 427/164 |
| 4,394,434 | 7/1983 | Rohloff | 430/270 |
| 4,423,136 | 12/1983 | Crivello et al. | 430/281 |
| 4,491,628 | 1/1985 | Ito et al. | 430/326 X |
| 4,552,833 | 11/1985 | Ito et al. | 430/270 X |
| 4,564,579 | 1/1986 | Morita et al. | 430/311 X |

FOREIGN PATENT DOCUMENTS 0102104 9/1978 Japan ..................... 430/326

OTHER PUBLICATIONS

S. J. Gillespie, "Shaped Siloxane Process", *IBM Technical Disclosure Bulletin*, vol. 26, No. 7B Dec. 1983, pp. 3965–3966.

IBM Technical Disclosure Bulletin, vol. 23, No. 8 Jan. 1981, Photoinitiated Doping, p. 3852.

*Primary Examiner*—John E. Kittle
*Assistant Examiner*—Cynthia Hamilton
*Attorney, Agent, or Firm*—Perman & Green

[57] ABSTRACT

A photoresist composition comprised of a radiation scissionable polymeric system having organopolysiloxane segments sensitized by an onium salt is disclosed. Useful organopolysiloxane containing polymers include polysiloxane-polycarbonate block copolymers, and polyorganosiloxane polyaryl esters. The resist films produced from the photoresist compositions exhibit high sensitivity, high thermal stability and resistance to oxygen reactive ion etching which makes them desirable for dry etching processes to enable submicron resolution.

13 Claims, No Drawings

POSITIVE RESIST SYSTEM HAVING HIGH RESISTANCE TO OXYGEN REACTIVE ION ETCHING

BACKGROUND OF THE INVENTION

1. Field of the Invention

The present invention is directed to a novel resist composition capable of submicron lithographic patterns. In particular, the present invention is directed to a resist composition for positive tone images that has deep UV-light (200–300 nanometers) sensitivity and high resistance to oxygen reactive ion etching.

2. Description of the Prior Art

In the manufacture of various semiconductor devices wherein an oxide nitride or an organic polymer coating is formed on a semiconductor substrate, it is often required to remove selected portions of these coatings. This is done conventionally by applying a photoresist film to the desired substrate, imagewise exposing the photoresist to a source of radiation, such as ultra violet light, electron beam or x-rays, developing the exposed photoresist with a solvent to form a relief pattern which is replicated into the underlying inorganic or organic polymer layer by wet processing or dry etching according to conventional reactive ion etching techniques using oxygen or fluorocarbon gases as the etchant. In positive photoresists there is a significant increase in the solubility of the regions exposed to the radiation relative to the unexposed regions while in the case of negative photoresists the regions exposed to the radiation become relatively less soluble. After etching, the remaining photoresist is stripped from the substrate.

With regard to the methods of etching enumerates above, chemical etching, or wet etching has been eminently successful. However, with the continued miniaturization of semiconductor integrated circuits to achieve greater component density and smaller units of large scale integrated circuitry, the art is rapidly approaching a point where wet etching may become impractical for providing the high resolution required for fine definition of high density metallization network as the duration of the etching must be carefully controlled to prevent under or over-etching of the film layer.

Dry etching, and in particular oxygen reactive ion etching of organic polymer coatings as come to be recognized as a superior and practical alternative to wet etching, the etching equipment assuring adequate process control of the most precise thin film patterns.

One of the problems associated with reactive ion etching of thin films, however, is that most of the prior art positive photoresist compositions have high each rates under the conditions of reactive ion etching with etchant gases such as oxygen of the underlying layers and thus have limited application as an etch mask.

Attempts to improve the resistance of the photoresist to oxygen reactive ion etching generally reduce the sensitivity of the photoresist to radiation.

SUMMARY OF THE INVENTION

In accordance with the present invention, there is provided a photoresist composition having high radiation sensitivity, high resolution capability and resistance to oxygen reactive ion etching, wherein the photoresist composition is comprised of a radiation sissionable polymeric system having organopolysiloxane segments and contain an effective amount of an onium salt as a photosensitizer.

The resists produced in accordance with the present invention exhibit high sensitivity to deep UVA radiation and high resistance to oxygen reactive ion etching which makes them desirable for dry etching techniques to provide excellent submicron resolution.

As will hereinafter be illustrated, the photoresist compositions of the present invention may be employed as the imaging layer in bilayer resist processes to delineate high resolution positive tone patterns by the conventional resist expose/solvent development sequence followed by etching through the underlying polymer layer using oxygen reactive ion etching. Due to the high thermal stability and oxygen reactive ion etching resistance of the photoresist compositions of the present invention, the unexposed area of the resist layer serves as a mask during oxygen reactive ion etching to effect image transfer into the base layer thereby eliminating the need for a separate barrier layer on the organic polymer base layer.

When used in conjunction with a lift-off polymer underlayer the photoresist compositions of the present invention can be used for metal patterning in accordance with standard lift-off techniques.

DETAILED DESCRIPTION OF THE INVENTION

The term "scissionable polymeric system having organopolysiloxane segments" as it is used in the present application means a silicon containing polymer which, in the presence of an onium salt photosensitizer will undergo main polymeric chain cleavage upon exposure to radiation such as ultraviolet light or electron beam.

Illustrative examples of scissionable silicon containing polymers having organo polysiloxane segments include polysiloxane-polycarbonate block copolymers of the type disclosed in U.S. Pat. Nos. 2,999,845, 3,189,662 and Vaughn, Polymer Lett. 7 569 (1969). These silicon containing polymers are block copolymers comprised of from 10 to 50 percent by weight of a polydiorganosiloxane composed of from about 2 to about 20 chemically combined diorganosiloxy units consisting essentially of dialkylsiloxy, alkyl aryl or diarylsiloxy units which are connected to each other by silicon-oxygen-silicon linkages wherein each of the silicon atoms has two organo radicals attached through a carbon-silicon bond. These materials contain from 90 to 50 percent by weight of an intercondensation product of a bis phenol and a carbonyl halide, which is then linked to the polydiorganosiloxane segment.

Exemplary of polysiloxane-polycarbonate copolymers are polydimethylsiloxane-bisphenol A-carbonate block copolymers of the formula:

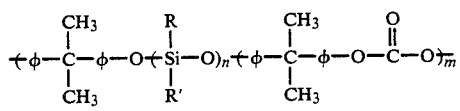

where R and $R^1$ are alkyl groups containing 1 to 3 carbon atoms phenyl, and alkoxyphenyl groups and m and n represent repeating units wherein n is an integer from 2 to 10 representing the average chain length of the siloxane segment and m is an integer from 1 to 8 representing the average chain length of the carbonate segment.

Other scissionable silicon containing polymeric systems having organosiloxane segments include polyorganosiloxane polyaryl esters having the formulae:

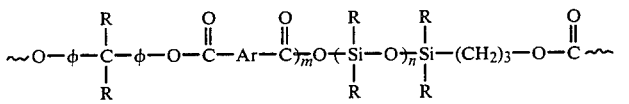
a.

where φ is phenyl, Ar is a meta or para phenylene radical, R is an alkyl group containing 1 to 4 carbon atoms, m is an integer from 1 to 6, and n is an integer from 2 to 10.

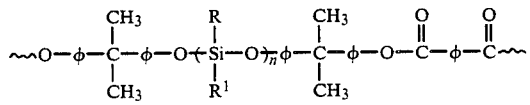
b.

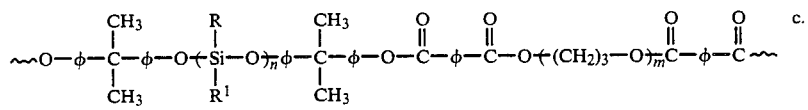
c.

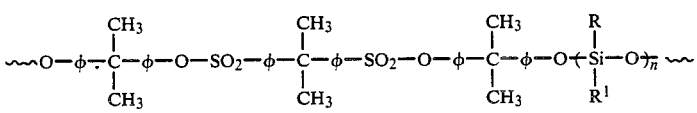
d.

wherein in each of the formulae b-d, R and $R^1$ are alkyl groups containing 1 to 3 carbon atoms, aryl groups such as phenyl, alkoxy phenyl, m is an integer from 1 to 6 and n is an integer from 2 to 10.

The onium salts utilized as photosensitizers in the photoresist compositions of the present invention include iodonium, sulfonium and diazonium salts. The sulfonium salts are preferred in the practice of the present invention.

Sulfonium salts particularly useful in the practice of the present invention are represented by the formula:

[R $R^1R^2$S]$^+$Y$^-$ in which R, $R^1$ and $R^2$ are independently selected from aromatic carbocyclic or heterocyclic radicals having from 6 to 20 carbon atoms, which can be substituted with 1 to 4 monovalent radicals selected from $C_{1-8}$ alkoxy, $C_{(1-8)}$ alkyl, nitro, and chloro and Y$^-$ represents an anion of the general formula $MX_f{}^{g-}$ in which M is a metal or metalloid atom, X is a halogen atom such as fluorine, chlorine, bromine or iodine atom, f is an integer from 4 to 6, and g, the net negative charge, is an integer from 1 to 5.

Metal or metalloid atoms in the formula $MX_f{}^{g-}$ include the transition metals, Sb, Fe, Sn, Bi, Al, Ga, In, Ti, Zn, Sc, V, Cr, Mn, Cs, rare earth elements such as the lanthanides, for example Cd, Pr, Nd and the actinides such as Pa, U and Np, and the metalloids such as B, P and As.

Complex metal halides $MX_f{}^{g-}$ in the sulfonium salt formula set forth above include for example, $BF_4{}^-$, $PF_6{}^-$, $AsF_6{}^-$, $SbF_6{}^-$, $FeCl_4{}^-$, $SnCl_6{}^-$, $SbCl_6{}^-$, $BiCl_5{}^=$, $AlF_6{}^{=-}$, $GaCl_4{}^-$, $InF_4{}^-$, $TiF_6{}^-$, and $ZrF_6{}^-$.

Suitable examples of sulfonium salts useful in the practice of the present invention include:
triphenylsulfonium tetrafluoroborate
triphenylsulfonium hexafluorophosphate
triphenylsulfonium hexafluoroantimonate
triphenylsulfonium hexafluoroarsenate
triphenylsulfonium triflate
tris(4-methoxyphenyl)sulfonium hexafluoroarsenate
tris(3,5-dimethyl-4-hydroxyphenyl)sulfonium hexa-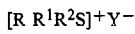fluroarsenate The sulfonium salts used as photosensitizers in the practice of the present invention are well known and recognized in the art.

For example triaryl-substituted sulfonium compounds, for example, can be prepared by procedures described in G. H. Wiegand, et al. Synthesis and Reactions of Triaryl Sulfonium Halides, J. Org. Chem. 33, 2671-75 (1968). Triaryl-substituted sulfonium compounds can be prepared in accordance with the procedure described in U.S. Pat. No. 2,807,648 from which the complex sulfonium salts can be made. The complex sulfonium salts can be prepared from the corresponding simple salts, such as the halide salts, by metathesis with a metal or ammonium salt of the companion anion desired. The synthesis, properties and photoinitiated cationic polymerization using triarylsulfonium salts is disclosed in J. Polym. Science: Polym. Chem. Div. Vol. 17, pgs. 977-999 (1979).

Examples of iodonium salts useful as photosensitizers in the practice of the present invention include aromatic iodonium complex salts such as:
diphenyliodonium hexafluoroarsenate
diphenyliodonium tetrafluoroborate
di(4-methyl phenyl)iodonium hexafluorophosphate
diphenyliodonium hexafluoroantimonate The iodonium salts used as photosensitizers in the practice of the present invention are also well known and recognized in the art, for example, U.S. Pat. Nos. 3,565,906, 3,712,920, 3,759,989 and 3,763,187, F. Beringer et al, Diaryl Iodonium Salts IX, J. Am. Chem. Soc. 81, 342-51 (1959) and F. Beringer, et al, Diaryliodonium Salts XXIII, J. Chem. Soc. 1964, 442-51.

A suitable example of diazonium salts useful in the practice of the present invention is
aryldiazonium tetrafluoroborate
aryldiazonium perchlorate
aryldiazonium trifluorate The onium salts used to prepare the photoresist compositions of the present invention are radiation sensitive and are known to result in photochemical generation of strong protonic acids when exposed to radiation, e.g. ultraviolet radiation. For example, triarylsulfonium hexafluoroarsenate upon photolysis or UV exposure transforms in accordance with the equation:

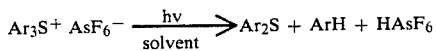

$$Ar_3S^+ \, AsF_6^- \xrightarrow[\text{solvent}]{h\nu} Ar_2S + ArH + HAsF_6$$

The generation of the strong protonic acid, $HAsF_6$, within the silicon containing polymer matrix upon UV radiation exposure causes chemical changes in the exposed regions whereby either crosslinking or depolymerization scission takes place. In the event of cross-linking of the silicon containing polymer there is a decrease in solubility after irradiation, and the photoresist composition functions as a negative resist. Conversely, if the scission or depolymerization process predominates and the solubility of the polymer increases after irradiation, the photoresist functions as a positive resist.

To prepare the photoresist compositions of the present invention, the onium salt is admixed with the silicon containing polymer having organosiloxane segments at a concentration of about 1 to about 15 percent by weight of the polymer solids in the photoresist composition.

The photoresist compositions of the present invention suitable for application to semiconductor substrates comprising the silicon containing polymer having organosiloxane segments and the onium salt are dissolved in a suitable common solvent or solvents including, for example, chlorobenzene, toluene, anisole, dioxane, ethylene glycol monoalkyl ethers and their acetate esters such as ethylene glycol monomethyl ether, ethylene glycol monomethylether acetate, 2-methoxyethyl acetate and isoamylacetate. The resist compositions of the present invention typically contain about 4 to about 40% solids by weight and preferably about 6 to 20% solids by weight of the solvent solution.

The solvent solutions of the photoresist compositions of the present invention can be applied onto a substrate by any conventional method used in the photoresist art, preferably spraying, or spin coating. When spin coating, for example, the resist solution can be optimized as to the solids content to provide coatings of the desired thickness, by manipulating the spin speed and time.

After the resist composition is coated onto the substrate, it is baked at approximately 90° to 105° C. for about 20 to about 35 minutes so that substantially all the solvent evaporates and a thin photoresist layer in the order of about 0.2 to 1.0 micron in thickness remains on the substrate. The resist layer can then be exposed to a radiation source, e.g. deep ultraviolet, electron beam, x-rays or excimer laser as a source of deep ultraviolet radiation in any desired exposure pattern through direct write or electron beam exposure or use of suitable masks, negatives, stencils and templates for contact or projection printing in ultraviolet exposure.

The photoresist compositions of the present invention are particularly suitable for exposure to actinic radiation in the deep UV range i.e. radiation with wavelengths of approximately 220-290 nanometers. This is due to the absorption profile of the onium salt sensitizer incorporated in the photoresist composition.

After image-wise exposure to radiation, a post-bake of about 95° to about 105° C. for about 5 to about 20 minutes may be employed followed by image development with an organic solvent solution.

It has also been determined that the relief image obtained upon post bake can be fully developed by dry etching in oxygen containing about 1 to about 5% of a fluorocarbon gas such as $CF_4$ whereby the exposed area may be selectively removed without significant thickness loss in the unexposed areas of the resist layer.

Solvent development of the exposed resist layer preferentially dissolves and removes the exposed portions of the resist film to form a fully developed pattern. Various organic solvents useful for the development of the exposed photoresist layer include organic solvents such as esters such as butylacetate isoamyl acetate, cellosolve acetate, mixtures of esters and alcohols such as 20-30% isoamyl acetate in isopropanol, tetrahydrofuran and isopropanol ketones such as methyl isobutyl ketone in combination with aromatic hydrocarbons such as toluene and xylene or with alcohols such as methanol, ethanol or isopropanol.

The developed photoresist layer may then be used as a mask in oxygen reactive ion etching during pattern transfer in the underlying polymer layer. For metal patterning using lift-off processes, the resist compositions of the present invention are spun applied to form a thin layer over a polymer base layer coated on a substrate. After imagewise exposure and development, the resist pattern is etch transferred into the base layer by oxygen reactive ion etching with the imaging layer functioning as a mask in the reactive ion etching process. A final metal pattern is formed by blanket metallization and removal of the lift-off stencil by soaking the substrate in a suitable organic solvent such as N-methyl 2-pyrrolidinone.

The present invention is illustrated by the following examples:

EXAMPLE I

A polydimethylsiloxane-Bisphenol A-carbonate block copolymer (weight average molecular weight 150,000) containing about 35% of the polydimethyl siloxane segment relative to the non-silicon containing segment was dissolved in chlorobenzene by stirring at room temperature to form a 6% solution by weight based on resin solids.

An onium salt, triphenylsulfoniumhexafluoroarsenate was separately dissolved in cyclohexanone to form a 10% solution by weight of the salt.

The polydimethylsiloxane-carbonate copolymer solution was then filtered through a submicron 0.2 um silver membrane. Fifty grams of the filtered copolymer solution was admixed with 1.8 grams of the onium salt solution to prepare a resist formulation containing 6% onium salt based on the copolymer solids. The resist solution thus obtained was spin coated at 2000 rpm for 30 seconds on a silicon-silicon oxide (0.5 um thermally grown $SiO_2$) wafer and prebaked at 105° C. for 30 minutes to form a uniform film of about 0.5 um thickness. The resist film was then patternwise exposed with deep IV radiation using a Kasper mask aligner for 3 seconds followed by post baking at 95° C. for 5 minutes which provided clear relief images with submicron resolution. A fully developed pattern down to the wafer substrate was obtained by solvent immersion of the wafer in a solvent mixture of isoamyl acetate and isopropanol.

For purposes of comparison, the procedure of Example I was repeated with the exception that a 5% solution of polydimethylsiloxane (weight average molecular weight about 500,000) dissolved in isoamyl acetate was doped with a 10% solution of triphenylsulfonium hexafluoroarsenate in cyclohexanone to prepare a resist solution containing 6% by weight photosensitizer based on polydimethylsiloxane solids. The prebaked film when exposed to deep UV exposure for 10 seconds and post baked at 100° C. showed the formation of a very faint relief image.

For purposes of further comparison, the procedure of Example I was repeated with the exception that the resist composition was composed of a polycarbonate resin (weight average molecular weight about 50,000) doped with 6% triphenylsulfonium hexafluoroarsenate by weight of the resin solids. The prebaked film was patternwise exposed with deep UV radiation for 75 seconds. The exposed film was post-baked at 200° C. for 10 minutes and when followed by development with a dichloromethane-isopropyl alcohol mixed solvent system also showed formation of a very faint positive pattern.

EXAMPLE II

The procedure of Example I was repeated with the exception that the onium sallt used as the photosensitizer was triphenylsulfonium hexafluoroantimonate which was incorporated in the polydimethylsiloxane-carbonate copolymer solution at a concentration of 12 percent by weight based on resin solids.

The resist formulation prepared above was filtered through a 0.45 micron silver filter and spin applied onto the surface of a 1.9 um thick layer of hard baked (230° C.) AZ 1350J, on a silicon wafer. The AZ 1350J formulation is commercially available from Shipley Company and is based on a novolak-diazonaphthoquinone system conventionally employed as a resist material or as a hard baked underlayer. The resist was baked at 105° C. for 30 minutes to provide a 0.3 um thick film which was image wise exposed by projection printing with UV-2 on a PE-500 instrument at a scan speed of 1000 (aperture 4). This was followed by post-baking at 105° C. for 5 minutes whereby excellent quality relief images were formed. Development of the relief pattern with a isopropyl alcohol-isoamyl acetate mixed solvent system at room temperature for 1 minute gave a fully developed resist pattern with submicron resolution.

For pattern transfer into the underlying novolak underlayer, the developed composite system was oxygen reactive ion etched at 300 watts with 25 sccm $O_2$ flow in a modular diode for about 40 minutes to completely transfer the resist pattern into the novolak-based hard underlayer, with 50% overetch to provide the necessary overhang for metal lift-off processing.

The final thickness of the etched pattern was about 2.1 um, thereby demonstrating the effectiveness of the imaging layer as a mask for oxygen reactive ion etching. Scanning electron micrographs of the etched pattern indicated an excellent undercut profile further demonstrating that the organopolysiloxane resist layer functions as an effective oxygen reactive ion etching barrier during image transfer into the underlayer using oxygen reactive ion etching.

While specific components of the present system are defined above, many other variables may be introduced which may in any way affect, enhance, or otherwise improve the system of the present invention. These are intended to be included herein.

Although variations are shown in the present application, many modifications and ramifications will occur to those skilled in the art upon a reading of the present disclosure. These, too, are intended to be included herein.

We claim:

1. A photoresist composition exhibiting increased resistance to oxygen reactive ion etching, the composition being comprised of a scissionable polymeric system having organopolysiloxane segments and an effective amount of an onium salt photosensitizer, the scissionable polymeric system being selected from the group consisting of polysiloxane-polycarbonate block copolymers, and polyorganosiloxane polyaryl esters.

2. The photoresist composition of claim 1 wherein the polysiloxane-polycarbonate block copolymer has the formula $$\sim\sim\phi-\underset{\underset{CH_3}{|}}{\overset{\overset{CH_3}{|}}{C}}-\phi-O+\underset{\underset{R^1}{|}}{\overset{\overset{R}{|}}{Si}}-O\}_n\phi-\underset{\underset{CH_3}{|}}{\overset{\overset{CH_3}{|}}{C}}-\phi-O-\overset{\overset{O}{\|}}{C}-O\}_m\sim\sim$$

wherein R and $R^1$ are alkyl groups containing 1 to 3 carbon atoms, phenyl and alkoxy phenyl groups and m and n represent repeating units wherein n is an integer from 2 to 10 and m is an integer from 1 to 8 and $\phi$ is phenyl.

3. The photoresist composition of claim 1 wherein the polyorgano siloxane polyaryl ester has the formula:

$$\sim\sim+O-\phi-\underset{\underset{R}{|}}{\overset{\overset{R}{|}}{C}}-\phi-O-\overset{\overset{O}{\|}}{C}-Ar-\overset{\overset{O}{\|}}{C}\}_m O+(CH_2)_3+\underset{\underset{R}{|}}{\overset{\overset{R}{|}}{Si}}-O\}_n\underset{\underset{R}{|}}{\overset{\overset{R}{|}}{Si}}+(CH_2)_3-O-\overset{\overset{O}{\|}}{C}\}\sim\sim$$

wherein R is an alkyl group containing 1 to 3 carbon atoms, $\phi$ is phenyl, Ar is a phenylene radical, and m is an integer from 1 to 6, and n is an integer from 2 to 10.

4. The photoresist composition of claim 1 wherein the polyorganosiloxane-polyaryl ester has the formula:

$$\sim\sim O-\phi-\underset{\underset{CH_3}{|}}{\overset{\overset{CH_3}{|}}{C}}-\phi-O+\underset{\underset{R^1}{|}}{\overset{\overset{R}{|}}{Si}}-O)_n-\phi-\underset{\underset{CH_3}{|}}{\overset{\overset{CH_3}{|}}{C}}-\phi-O-\overset{\overset{O}{\|}}{C}-\phi-\overset{\overset{O}{\|}}{C}\sim\sim$$

wherein R and $R^1$ are alkyl groups containing 1 to 3 carbon atoms, phenyl and alkoxy phenyl groups and n is an integer from 2 to 10 and $\phi$ is phenyl.

5. The photoresist composition of claim 1 wherein the polyorganosiloxane-polyaryl ester has the formula:

$$\sim\sim O-\phi-\underset{\underset{CH_3}{|}}{\overset{\overset{CH_3}{|}}{C}}-\phi-O+\underset{\underset{R^1}{|}}{\overset{\overset{R}{|}}{Si}}-O\}_n\phi-\underset{\underset{CH_3}{|}}{\overset{\overset{CH_3}{|}}{C}}-\phi-O-\overset{\overset{O}{\|}}{C}-\phi-\overset{\overset{O}{\|}}{C}-O+(CH_2)_3-O\}_m\overset{\overset{O}{\|}}{C}-\phi-\overset{\overset{O}{\|}}{C}\sim\sim$$

where R and $R^1$ are alkyl groups containing 1 to 3 carbon atoms, phenyl and alkoxy phenyl groups, m is an integer from 1 to 6 and n is an integer from 2 to 10 and φ is phenyl.

6. The photoresist composition of claim 1 wherein the polyorganosiloxane-polyaryl ester has the formula:

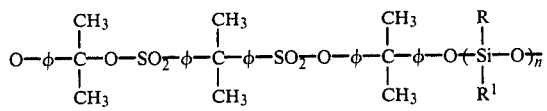

where R and R¹ are alkyl groups containing 1 to 3 carbon atoms, phenyl and alkoxy phenyl groups and n is an integer from 2 to 10 and φ is phenyl.

7. The photoresist of claim 1 wherein the onium salt is selected from the group of salts consisting of iodonium, diazonium and sulfonium salts.

8. The photoresist of claim 1 wherein the onium salt has the formula

[R R¹R²S+]Y− in which R, R¹ and R² are independently selected from aromatic carbocyclic and heterocyclic radicals having from 6 to 20 carbon atoms, aromatic carbocyclic and heterocyclic radicals substituted with 1 to 4 monovalent radicals selected from $C_{1-8}$ alkoxy, $C_{(1-8)}$, alkyl, nitro and chloro, and Y− represents an anion of the general formula $MX_f^{g-}$ in which M is a metal or metalloid atom, X is a halogen selected from fluorine, chlorine, bromine and iodine, f is an integer from 4 to 6, and g is an integer from 1 to 3.

9. The composition of claim 8 wherein M is selected from the group of elements consisting of As, B, Sb and P.

10. The composition of claim 8 wherein the onium salt is triphenylsulfonium hexafluoroarsenate.

11. The composition of claim 8 wherein the onium salt is triphenylsulfonium hexafluoro antimonate.

12. A method for forming an image with a high resolution, radiation sensitive, thermally stable resist comprising the steps of forming on a substrate a film comprising the composition of claim 1, exposing the film in a predetermined pattern to radiation and removing the radiation exposed portion of the film with a solvent.

13. The method of claim 12 wherein the radiation exposed film is dry etched by oxygen reactive ion etching after removal of the radiation exposed portion of the film with solvent.

* * * * *